United States Patent [19]
Whiteley et al.

[11] Patent Number: 5,841,802
[45] Date of Patent: Nov. 24, 1998

[54] MULTIPLE, ISOLATED STRAINED QUANTUM WELL SEMICONDUCTOR LASER

[75] Inventors: J. Stanley Whiteley, Bridgeton; Neil F. Ruggieri, Florissant; Robert R. Rice, Chesterfield, all of Mo.

[73] Assignee: McDonnell Douglas Corporation, St. Louis, Mo.

[21] Appl. No.: 705,732

[22] Filed: Aug. 30, 1996

[51] Int. Cl.$^6$ .................................................... H01S 3/18
[52] U.S. Cl. ................... 372/45; 372/96; 372/98
[58] Field of Search ................... 372/45, 96, 43, 372/98; 357/16

[56] References Cited

U.S. PATENT DOCUMENTS

| | | | |
|---|---|---|---|
| 4,881,236 | 11/1989 | Brueck et al. | 372/45 |
| 5,099,295 | 3/1992 | Ogawa | 357/16 |
| 5,212,706 | 5/1993 | Jain | 372/45 |
| 5,247,533 | 9/1993 | Kazaki et al. | 372/45 |
| 5,263,040 | 11/1993 | Hayakawa | 372/45 |
| 5,294,808 | 3/1994 | Lo | 257/17 |
| 5,321,713 | 6/1994 | Khan et al. | 372/45 |
| 5,339,325 | 8/1994 | Kito et al. | 372/45 |
| 5,363,392 | 11/1994 | Kasukawa et al. | 372/45 |
| 5,394,422 | 2/1995 | Fitzpatrick | 372/45 |
| 5,422,902 | 6/1995 | Mensz | 372/43 |
| 5,461,637 | 10/1995 | Mooradian et al. | 372/98 |
| 5,465,263 | 11/1995 | Bour et al. | 372/23 |
| 5,491,710 | 2/1996 | Lo | 372/45 |
| 5,513,202 | 4/1996 | Kobayashi et al. | 372/96 |
| 5,677,923 | 10/1997 | Vice et al. | 372/43 |

*Primary Examiner*—Rodney Bovernick
*Assistant Examiner*—Yisun Song
*Attorney, Agent, or Firm*—Westlund & Powell, P.C.; Robert A. Westerlund; Raymond H.J. Powell, Jr.

[57] ABSTRACT

An electron beam pumped semiconductor laser which includes a substrate, an optical gain structure provided on the substrate, the optical gain structure being comprised of a plurality of alternating quantum well layers and isolation layers, the quantum well layers being spaced apart from one another by respective, intervening ones of the isolation layers by a sufficient distance to substantially isolate the quantum well layers from one another, and a first reflective layer provided on a first surface of the optical gain structure. With this construction, the quantum well layers are quantum mechanically uncoupled. Further, the optical gain structure has a total thickness which is sufficient to enable the optical gain structure to be coupled to excitation of an electron beam produced by an electron beam pumping device and directed through the first reflective layer and incident upon the optical gain structure. All of the quantum well layers of the optical gain structure are preferably well-matched in terms of their thickness and compositional uniformity, so that each of the quantum well layers effectively functions as an independent optical gain region having a spectral gain region which is substantially coincident with that of all of the other quantum well layers. Preferably, each of the quantum well layers is strained, with each of the strained quantum well layers preferably having a thickness less than their pseudomorphic strain limit thickness. The semiconductor laser preferably further includes a second reflective layer provided on a second surface of the optical gain structure, whereby a laser cavity is provided in the region bounded by the first and second reflective layers, with the first reflective layer serving as the rear mirror and the second reflective layer serving as the front or output mirror of the laser. The first reflective layer is preferably mostly transmissive with respect to the electron beam and mostly reflective with respect to the laser light generated within the laser cavity. The second reflective layer is preferably partially transmissive and partially reflective with respect to the laser light generated within the laser cavity.

16 Claims, 1 Drawing Sheet

MULTIPLE, ISOLATED STRAINED QUANTUM WELL SEMICONDUCTOR LASER

BACKGROUND OF THE INVENTION

The present invention relates generally to semiconductor lasers, and more particularly, to an electron beam pumped semiconductor laser having an optical gain region which includes multiple, isolated quantum well layers.

Semiconductor lasers having a multiple quantum well gain medium have been developed for applications including optical communications, optical interconnects, optical computing, and video display panels, which benefit from a number of advantages provided by such lasers. These advantages include low threshold current, single mode behavior, circular beam pattern, high packing density, and relatively simple fabrication.

Semiconductor lasers having a multiple quantum well gain medium are commonly referred to as "multiple quantum well semiconductor lasers". In general, multiple quantum well semiconductor lasers include an optical gain region comprised of a plurality of alternating quantum well layers and barrier layers. All of the quantum well layers are quantum mechanically coupled, to thereby provide a "unitary" (albeit multilayer) quantum well structure.

It is known in the art that the optical gain provided by such a multilayer quantum well structure can be increased by introducing compressive or tensile strain to the quantum well layers to thereby modify the energy bandgap structure thereof. However, such strained quantum well layers impose a critical constraint on the overall thickness of the multilayer quantum well structure, due to the fact that thicknesses above a critical upper limit result in disclocation and other unacceptable defects due to lattice mismatch between the alternating quantum well and barrier layers of the multilayer quantum well structure during the fabrication process, and particularly, during the process of epitaxially growing the layers on a substrate or growth matrix. This constraint is commonly referred to as the "critical thickness constraint".

U.S. Pat. No. 5,491,710, issued to Lo on Feb. 13, 1996 discloses a multilayer quantum well structure which purportedly overcomes this critical thickness constraint. In particular, Lo discloses a multilayer quantum well structure in which each of the quantum well layers is strained, for example, by applying a compressive force thereto, while the adjacent barrier layer is placed in tension with an equal and opposite force so that it cancels the compressive strain imparted to the quantum well. This results in each pair of quantum well and barrier layers having a zero net strain. Thus, Lo teaches that, in this manner, a plurality of strained quantum well-barrier layer pairs having a zero net strain can be stacked on one another with no overall strain buildup, even if the overall thickness of the multilayer quantum well structure exceeds the critical thickness.

However, the multilayer quantum well structure proposed by Lo suffers from several significant drawbacks and shortcomings. Namely, the Lo multilayer quantum well structure adds significant complexity to the fabrication process. In fact, it is doubtful that such a structure could be made using practical fabrication processes such as epitaxial growth of the layers on a substrate or growth matrix. Certainly, it would be exceedingly difficult to control the deposition or growth process with the extremely high precision which would be required in order to produce quantum well-barrier layer pairs having zero net gain. Certainly, it could be expected that some amount of net strain would be imparted to the overall multilayer quantum well structure by each quantum well-barrier layer pair. Thus, as a practical matter, there would apparently still be a critical thickness of the overall multilayer quantum well structure above which unacceptable disclocation or other defects due to lattice mismatch of the quantum well structure and the substrate or growth matrix would occur. It is notable that the laser structure taught by Lo relies upon spatially-limited current injection from a P-N junction diode to produce the population inversion of the multilayer quantum well structure required to initiate the lasing action. Lo does not suggest that the excitation mechanism for his laser could be electron beam pumping.

In this connection, in an electron beam pumped semiconductor laser, the energy of the electron beam used for pumping the laser is deposited over an extended range which depends upon the exact nature of the semiconductor material and the energy of the incident electrons. Typically, this range is on the order of 5–10 microns for common semiconductor materials, assuming a typical electron beam energy level of 30–65 keV. In this regard, Lo discloses a representative embodiment of his proposed multilayer quantum well structure having an overall thickness of 0.2–0.3 microns, which is obviously much narrower than would be required for electron beam pumping. In order to effectively utilize the electron beam pumping energy, the electron-hole plasma created by the incident electrons must be effectively distributed over an optical gain structure having a thickness of 5–10 microns, which is not believed to be practically achievable using any presently known quantum well structure.

Presently available electron beam pumped semiconductor lasers employ thick, bulk semiconductor plates which have a number of significant drawbacks and shortcomings. Namely, lasers of this type can not be fabricated using advanced epitaxial growth techniques, have a limited laser beam output wavelength range, provide limited optical gain (relative to multiple quantum well structure), and are not thermally efficient.

Based on the above and foregoing, it can be appreciated that there presently exists a need in the art for an electron beam pumped multiple quantum well semiconductor laser which overcomes the above-described drawbacks and shortcomings of the presently available technology. The present invention addresses and fulfills this need in the art.

SUMMARY OF THE INVENTION

The present invention encompasses an electron beam pumped semiconductor laser which includes a substrate, an optical gain structure provided on the substrate, the optical gain structure being comprised of a plurality of alternating quantum well layers and isolation layers, the quantum well layers being spaced apart from one another by respective, intervening ones of the isolation layers by a sufficient distance to substantially isolate the quantum well layers from one another, The electron beam pumped semiconductor layers of the present invention preferably further includes a first reflective layer provided on a first surface of the optical gain structure.

With this construction, the quantum well layers are quantum mechanically uncoupled. Further, the optical gain structure has a total thickness which is sufficient to enable the optical gain structure to be coupled to excitation of an electron beam produced by an electron beam pumping device and directed through the first reflective layer and incident upon the optical gain structure.

All of the quantum well layers of the optical gain structure are preferably well-matched in terms of their thickness and compositional uniformity, so that each of the quantum well layers effectively functions as an independent optical gain region having a spectral gain region which is substantially coincident with that of all of the other quantum well layers. Preferably, each of the quantum well layers is strained, with the distance between successive ones of the quantum well layers being sufficient to permit substantially complete relaxation of strain associated with the strained quantum well layers. Each of the strained quantum well layers preferably has a thickness less than their pseudomorphic strain limit thickness.

The semiconductor laser of the present invention preferably further includes a second reflective layer provided on a second surface of the optical gain structure, whereby a laser cavity is provided in the region bounded by the first and second reflective layers, with the first reflective layer serving as the rear mirror and the second reflective layer serving as the front or output mirror of the laser.

The first reflective layer is preferably mostly transmissive with respect to the electron beam and mostly reflective with respect to the laser light generated within the laser cavity. The second reflective layer is preferably partially transmissive and partially reflective with respect to the laser light generated within the laser cavity.

The substrate is preferably an optically transparent substrate, e.g., a sapphire substrate. The second reflective layer can suitably be a dielectric mirror comprised of a plurality of layers having a bandgap greater than the wavelength of the laser light generated within the laser cavity to enable coupling of the laser emission from the laser cavity through the transparent substrate.

The quantum well layers and isolation layers comprising the optical gain structure are preferably epitaxially grown layers made of a binary, ternary, or quaternary compound semiconductor material formed of elements selected from Groups III and V of the periodic table of elements. The second reflective layer is also preferably epitaxially grown on the substrate, and preferably provides the growth matrix for the epitaxially grown quantum well and isolation layers comprising the optical gain structure.

BRIEF DESCRIPTION OF THE DRAWINGS

These and various other features and advantages of the present invention will be readily understood with reference to the following detailed description of the invention taken in conjunction with the accompanying drawings, in which.

DETAILED DESCRIPTION OF THE INVENTION

Figure 1:
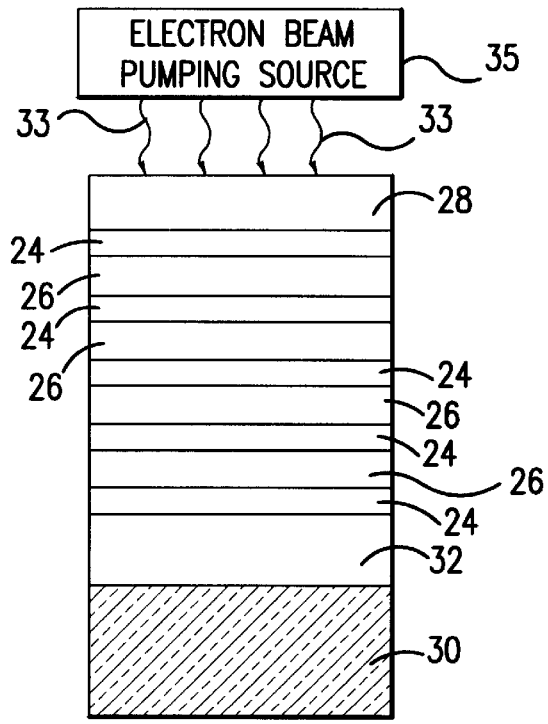
FIG. 1 is a cross-sectional view of a multiple, isolated strained quantum well semiconductor laser constructed in accordance with an exemplary embodiment of the present invention; and, FIG. 2 is a diagram which plots a curve showing the electron-hole generation rate (right vertical axis) versus distance from the rear mirror of the laser cavity (horizontal axis), plots a bar graph showing the value of $Al_yGa_{1-y}N$, where y=0–1 (upper left vertical axis) versus distance (horizontal axis), and plots a bar graph showing the x value of $In_xGa_{1-x}N$ (lower left vertical axis) versus distance (horizontal axis), for an exemplary implementation of the MISQW semiconductor laser of the present invention.

In overview, the present invention embraces an electron beam pumped multiple quantum well semiconductor laser having a multiple, isolated quantum well structure comprised of a plurality of quantum well layers which are essentially isolated from one another by intervening isolation layers. Although not limiting to the present invention, in its broadest sense, the individual quantum well layers of the multiple, isolated quantum well structure are preferably strained, to thereby increase the optical gain provided thereby, thereby resulting in a multiple, isolated strained well (MISQW) structure.

In the following description, the multilayer quantum well structure of the semiconductor laser of the present invention will be referred to as the MISQW structure for the sake of simplicity, it being recognized that there is not requirement that the individual quantum well layers be strained.

A significant aspect of the present invention resides in the isolation of the quantum well layers from one another, meaning that the quantum well layers are not quantum mechanically coupled as in presently available multiple quantum well semiconductor lasers. This is achieved by utilizing isolation layers which are thicker than the barrier layers utilized in the presently available multiple quantum well semiconductor lasers, and more particularly, which are sufficiently thick to essentially isolate the individual quantum well layers from one another.

Because the quantum well layers of the MISQW structure are quantum mechanically uncoupled (i.e., essentially isolated from one another), their spectral gain regions will coincide to provide additive optical gain, as long as the individual quantum well layers are well-matched in terms of their thickness and compositional uniformity. In this connection, the individual quantum well layers of the MISQW structure effectively function as independent optical gain regions. This provides a significant advantage over the presently available multiple quantum well semiconductor lasers, in which the multiple quantum well layers are quantum mechanically coupled, since quantum mechanically coupled quantum well layers function as a "unitary" active layer or optical gain region, whereby the population inversion produced by the coupling of the excitation energy of the incident electrons from the electron beam pumping source decreases as a function of the depth of the multilayer quantum well structure, thereby limiting the achievable optical gain provided thereby.

It should be noted that although current injection-excited resonant-periodic gain semiconductor lasers also employ multiple, quantum mechanically uncoupled quantum well optical gain regions, these lasers require precise placement of the quantum wells at the anti-nodes of the standing wave laser field, thereby rendering such devices difficult to fabricate and unsuitable for coupling to a high energy electron beam. In this regard, as will become fully apparent hereinafter, the MISQW semiconductor laser of the present invention operates on a completely different principle and thus does not have this requirement. More particularly, the quantum wells of the MISQW structure of the semiconductor laser of the present invention are placed over a much wider region in order to facilitate coupling to a high energy electron beam.

Moreover, as long as the individual quantum well layers of the MISQW structure of the semiconductor laser of the present invention are made thinner than the pseudomorphic strain limit thickness, they can be formed from semiconductor materials that are lattice mismatched with the substrate or growth matrix without generating disclocation and other defects, thereby enabling the fabrication of a multilayer quantum well structure having any desired thickness, there being no critical thickness constraint as with the presently available multiple quantum well semiconductor lasers.

By thus eliminating the critical thickness constraint, the MISQW structure can be made to have an overall thickness which is sufficient for precise coupling to the excitation of any high-energy electron beam, thereby providing much higher optical gain than can be achieved by the presently available multiple quantum well semiconductor lasers which rely upon current injection as the excitation mechanism.

With respect to the presently available electron beam pumped semiconductor lasers, the multiple, isolated quantum well (MISQW) semiconductor laser of the present invention provides several significant advantage thereover. For example, in the fabrication of the semiconductor laser of the present invention, advanced epitaxial growth techniques such as molecular beam epitaxy (MBE) or metallo-organic chemical vapor deposition (MOCVD) can be used, and semiconductor materials having compositions which provide an emissive spectra not achievable with bulk semiconductors can be used. For example, the MISQW semiconductor laser of the present invention can be constructed to generate a laser beam having any desired wavelength from 12 $\mu$m (infrared) to 250 nm (ultraviolet) by choosing appropriate semiconductor materials and quantum well thicknesses.

Further, the direct growth of the MISQW structure on a substrate or growth matrix improves the thermal conductivity of the structure, thereby enabling operation of the laser at greater power levels than are possible with presently available electron beam pumped semiconductor lasers which employ bulk semiconductor materials which are adhesively bonded to the substrate.

Further, the MISQW structure does not require any extrinsic doping in order to achieve electron-hole plasma formation, although it does allow any desirable doping species to be incorporated throughout the device to improve the performance thereof. For example, the characteristics of the semiconductor materials employed in the MISQW structure, and/or to provide conductivity for current return within the MISQW structure.

Yet further, the MISQW structure can be grown on transparent substrate materials, such as sapphire, thereby enabling the laser light to be coupled through the transparent substrate.

With reference now to FIG. 1, there can be seen a cross-sectional view of a MISQW semiconductor laser 20 constructed in accordance with an exemplary embodiment of the present invention. The laser 20 includes an MISQW structure 22 comprised of a plurality (e.g., 2–20) of quantum well layers 24 and a respective plurality of intervening isolation layers 26, a first reflective layer 28 provided on a first (e.g., rear) surface of the MISQW structure 22, a substrate 30, and a second reflective layer 32 interposed between the substrate 30 and a second (e.g., front) surface of the MISQW structure 22. The laser cavity is formed between the first and second reflective layers 28 and 32.

The first reflective layer 28 is preferably made of a material which is highly transmissive with respect to incident electrons 33 from an electron beam pumping source 35, but highly reflective with respect to the oscillating light waves generated in the laser cavity due to the stimulated emission of radiation (photons). For example, the first reflective layer 28 may be comprised of a layer of silver deposited to a thickness of less than 1,000 angstroms (i.e., less than 100 mm).

In general, the first reflective layer 28 should be thin enough to allow the incident electrons 33 to pass through with little attenuation (e.g., greater than 90–95% transmissivity with respect to the electrons 33), and should have a very high optical reflectivity (e.g., greater than 90–95% reflectivity) with respect to the light generated within the laser cavity. Of course, the specific material employed for the first reflective layer or coating 28 is not limiting to the present invention, in its broadest sense.

The MISQW structure 22 is preferably epitaxially grown to a thickness, e.g., approximately 5–10 microns, appropriate for efficiently coupling with the excitation energy of the incident electrons 33. The excitation energy of the incident electrons 33 is preferably high enough to create a population inversion of the quantum well layers 24 sufficient to generate electron-hole pairs at a high enough rate to trigger the lasing action, i.e., stimulated emission of radiation (photons) at radiative recombination sites in the quantum well layers 24. Typically, an energy level in the range of 10 kV–100 kV is appropriate.

The electron beam pumping source 35 can conveniently be an electron gun, a negative electron affinity cathode, a field emitter cathode, or any other suitable device. The individual quantum well layers 24 preferably have a thickness in the range of 1–15 nm, e.g., 10 nm, and the individual isolation layers 26 disposed therebetween preferably have a thickness in the range of 20–500 nm. In general, the thickness of the individual quantum well layers 24 should be no greater than the pseudomorphic strain limit thickness.

In accordance with the present invention, the individual quantum well layers 24 are spaced far-enough apart to function as independent optical gain regions. Otherwise stated, the individual quantum well layers 24 are not quantum mechanically coupled, but rather, are essentially isolated from one another. Further, the quantum well layers 24 are spaced by amount such that the electron-hole plasma produced by the electron beam does not extend significantly beyond the overall thickness of the MISQW structure 22 and into unexcited regions, e.g., into the second reflective layer, which would result in undesirable absorption of the photons of the laser 20. Moreover, the quantum well layers 24 are preferably spaced sufficiently far apart to permit complete relaxation of strain associated with the pseudomorphically grown strained quantum wells.

Preferably, the isolation layers 26 are lattice-matched, and the individual quantum well layers 24 are well-matched with one another in terms of their thickness and compositional uniformity. The quantum well layers 24 and the isolation layers 26 can be made of any suitable semiconductor laser material known to those skilled in the pertinent art, as the specific composition of these layers is not limiting to the present invention, in its broadest sense. Of course, as will be readily evident to those skilled in the pertinent art, the semiconductor materials for the quantum well layers 24 are preferably chosen to have a lattice/bandgap structure which is suitable to emit stimulated radiation at a desired wavelength. In other words, the quantum well layers 24 are preferably tuned to emit laser light at the desired wavelength. Specific semiconductor laser materials which are suitable include IIIa–N compounds, e.g., InGaN and AlGaN, binary, ternary, and quaternary Group IIIa–Va compounds, e.g., GaInAlAsP, InGaAlSbAs, InGaAsP, etc.

The second reflective layer 32 is preferably made of a material which is partially transmissive and partially reflective with respect to the wavelength of the laser light generated within the laser cavity. Preferably, the second reflective layer 32 has a reflectivity in the range of 30%–90% with respect to the wavelength of the laser light generated within the laser cavity, the reflectivity being selected to at least provide sufficient feedback of laser light back into the laser cavity to facilitate oscillation of the light waves generated within the laser cavity. In this regard, the optical gain induced by the incident electron beam in the optical gain region must be greater than the total laser cavity losses due to the rear and front mirrors (first and second reflective layers 28 and 32, respectively) and any other absorption that may occur within the laser cavity, in order to produce laser emission.

The second reflective layer 32 may suitably be a multi-layer dielectric mirror (e.g., a dielectric mirror comprised of alternating GaN and $Al_yGa_{1-y}N$ (where y=0–1) layers) whose layers have an energy bandgap greater than the wavelength of the laser light generated within the laser cavity, or any other convenient laser output mirror, or reflective layer or grating known to those skilled in the pertinent art.

The substrate 30 is preferably made of a transparent material, e.g., sapphire, having a sufficient thickness (e.g., 1 cm) to withstand the environment in which the laser 20 is placed. By tuning the reflectivity/transmissivity of the second reflective layer 32 (front/output mirror), the majority of the laser light generated within the laser cavity can be coupled out of the laser 20 through the transparent substrate 30. However, it will be readily appreciated to those skilled in the pertinent art that the substrate 30 can be made of any suitable non-transparent material, in which case, the first reflective layer 28 can be made partially reflective/partially transmissive to serve as the output mirror of the laser, and the second reflective layer 32 can be made mostly reflective or even eliminated altogether.

Omission of the second reflective layer 32 constitutes an alternative embodiment of the present invention which may be appropriate for applications in which the device is to function as an optical amplifier or as a laser with external resonators being employed for mode control.

Alternatively, external mirrors can be used in lieu of either or both of the first and second reflective layers. For example, the MISQW structure 22 could be utilized as the gain element in a laser cavity with both the front and rear mirrors of the laser being provided external to the device.

Figure 2:
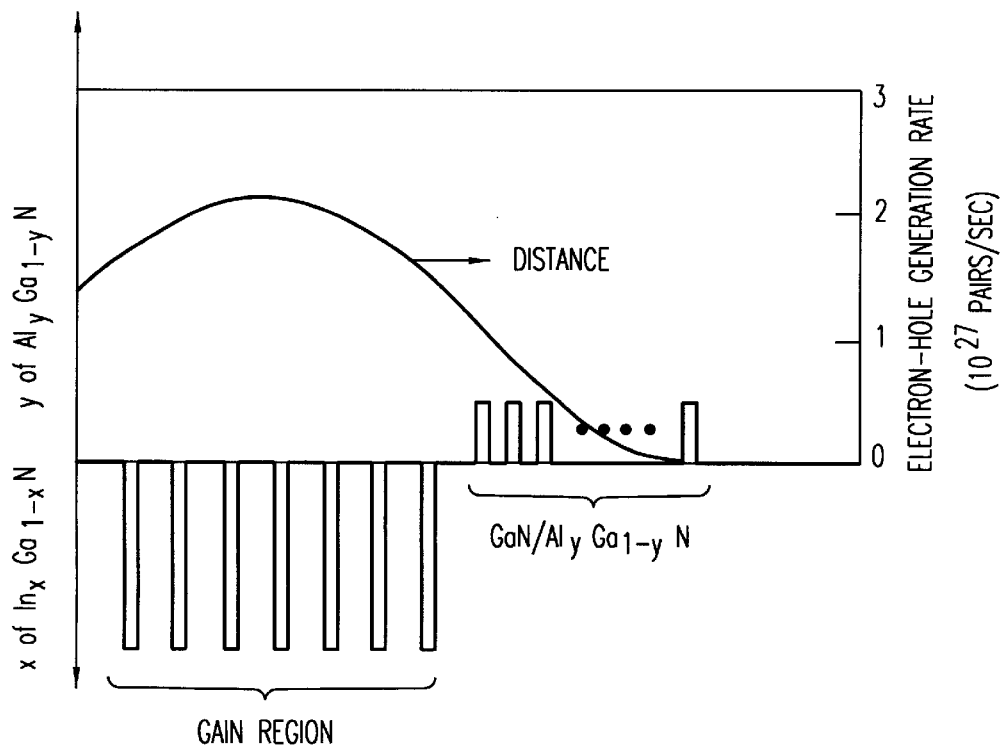

The desired coupling between the electron-hole plasma and the quantum well layers 24 is depicted in the diagram of FIG. 2, which plots a curve showing the electron-hole generation rate (right vertical axis) versus distance from the rear mirror (first reflective layer 28) of the laser cavity (horizontal axis), plots a bar graph showing the y value of $Al_yGa_{1-y}N$, where y=0–1 (upper left vertical axis) versus distance (horizontal axis), and plots a bar graph showing the x value of $In_xGa_{1-x}N$ (lower left vertical axis) versus distance (horizontal axis), for an exemplary implementation of the MISQW semiconductor laser 20 of the present invention, in which the laser 20 is constructed of 7 quantum well layers 24 made of $In_xGa_{1-x}N$ epitaxially grown to a thickness of approximately 10 nm (where x=0–1, e.g., x=0.9 for red laser emission, 0.7 for green laser emission, or 0.5 for blue laser emission), and a respective number of isolation layers 26 made of gallium nitride GaN) epitaxially grown to a thickness of approximately 100 nm, a transparent substrate 30 made of sapphire ($Al_2O_3$), a rear mirror (first reflective layer 28) comprised of a silver layer having a thickness of 1,000 angstroms or less, and a front (output) dielectric mirror (the second reflective layer 32) comprised of 19 pairs of 400 nm thick GaN/$Al_yGa_{1-y}N$ layers (e.g., y=0.3), where the growth matrix is GaN.

The laser/MISQW device of the present invention can be used as the emitting faceplate of a CRT to thereby provide a laser-CRT which can be used to form a display system by using red, green, and blue tubes, to form high brightness display systems for cinemas, auditoriums, arenas, computer monitors, command centers, visual flight simulators, and the like.

The laser/MISQW device of the present invention can also be used as the target in a non-scanned electron tube to produce high power pulses of light from the infrared (IR) to the ultraviolet (UV), which can be used in optical counter-measure devices, optical seeker sources, fiber optic communications systems, as the optical source in environmental monitoring systems, and the like.

Of course, there are many other possible uses and applications of the present invention which will become apparent to those skilled in the art, the above examples being given by way of illustration only.

Although the present invention has been described in detail hereinabove, it should be clearly understood that many variations and/or modifications of the basic inventive concepts taught herein which may appear to those skilled in the pertinent art will still fall within the spirit and scope of the present invention, as defined in the appended claims.

What is claimed is:

1. An electron beam pumped semiconductor laser, comprising:
   a substrate;
   an optical gain structure provided on said substrate, said optical gain structure being comprised of plurality of alternating strained quantum well layers and isolation layers, wherein said strained quantum well layers are spaced apart from one another by respective, intervening ones of said isolation layers by a sufficient distance to substantially isolate said strained quantum well layers from one another and to permit substantially complete relaxation of strain associated with said strained quantum well layers, whereby said strained quantum well layers are quantum mechanically uncoupled;
   wherein said strained quantum well layers are positioned non-coincident with antinodes of a standing laser field generated in said optical gain structure,
   wherein each of said strained quantum well layers has a thickness less than a pseudomorphic strain limit thickness, and a total thickness of said optical gain structure is sufficient to enable said optical gain structure to be coupled to excitation of an electron beam produced by an electron beam pumping device and incident upon said optical gain structure;
   wherein each of said strained quantum well layers effectively functions as an independent optical gain region; and
   wherein all of said strained quantum well layers have substantially coincident spectral gain regions.

2. The semiconductor laser as set forth in claim 1, wherein said quantum well layers and said isolation layers comprise respective epitaxially grown layers.

3. The semiconductor laser as set forth in claim 1, further comprising a first reflective layer provided on a first surface of said optical gain structure.

4. The semiconductor laser as set forth in claim 3, wherein said first reflective layer is highly transmissive with respect to said electron beam and highly reflective with respect to laser light generated within said laser cavity.

5. The semiconductor laser as set forth in claim 4, further comprising a second reflective layer, wherein said second reflective layer is partially reflective with respect to said laser light and partially transmissive with respect to said laser light.

6. The semiconductor laser as set forth in claim 5, wherein said second reflective layer comprises a dielectric mirror.

7. The semiconductor laser as set forth in claim 6, wherein said dielectric mirror is comprised of a plurality of layers having an energy bandgap greater than a wavelength of said laser light.

8. The semiconductor laser as set forth in claim 5, wherein said first reflective layer has a transmissivity of at least 90% with respect to said electron beam and a reflectivity of at least 90% with respect to said laser light.

9. The semiconductor laser as set forth in claim 8, wherein said second reflective layer has a transmissivity with respect to said laser light within a range of between 30%–90%.

10. The semiconductor laser as set forth in claim 5, wherein said second reflective layer has a transmissivity with respect to said laser light within a range of between 30%–90%.

11. The semiconductor laser as set forth in claim 5, wherein:

said second reflective layer is disposed between said substrate and said second surface of said optical gain structure; and, said second reflective layer is formed on a first surface of said substrate facing said second surface of said optical gain structure.

12. The semiconductor laser as set forth in claim 5, wherein:

said second reflective layer is disposed between said substrate and said second surface of said optical gain structure; and, said substrate comprises an optically transparent substrate.

13. The semiconductor laser as set forth in claim 1, wherein each of said quantum well layers and said isolation layers are comprised of semiconductor materials selected from a group consisting of binary, ternary, and quaternary compounds formed of elements from Groups III and V of the periodic table of elements.

14. The semiconductor laser as set forth in claim 1, wherein the strained quantum well layers are lattice mismatched with the substrate.

15. An electron beam pumped semiconductor laser, comprising:

a substrate; and an optical gain structure provided on the substrate, the optical gain structure being comprised of a plurality of alternating quantum well layers and isolation layers, with the thickness of the isolation layers being sufficient to ensure that the quantum well layers are quantum mechanically uncoupled from one another, and the total thickness of the optical gain structure being sufficient to enable the optical gain structure to be coupled to excitation of an electron beam, and wherein said quantum well layers are positioned non-coincident with antinodes of a standing laser field generated in said optical gain structure.

16. An electron beam pumped semiconductor laser, comprising:

a substrate; and an optical gain structure provided on the substrate, the optical gain structure being comprised of a plurality of alternating quantum well layers and isolation layers, with the thickness of the isolation layers being sufficient to ensure that the quantum well layers are quantum mechanically uncoupled from one another, and the total thickness of the optical gain structure being sufficient to enable the optical gain structure to be coupled to excitation of an electron beam; and, wherein the quantum well layers are lattice mismatched with the substrate and said quantum well layers are positioned non-coincident with antinodes of a standing laser field generated in said optical gain structure.

* * * * *